United States Patent [19]

Kaku et al.

[11] Patent Number: 4,819,242
[45] Date of Patent: Apr. 4, 1989

[54] SEMICONDUCTOR LASER DRIVER CIRCUIT

[75] Inventors: Toshimitsu Kaku, Sagamihara; Kazuo Shigematsu, Saitama, both of Japan

[73] Assignee: Hitachi, Ltd., Tokyo, Japan

[21] Appl. No.: 932,495

[22] Filed: Nov. 20, 1986

[30] Foreign Application Priority Data

Nov. 20, 1985 [JP] Japan ................................ 60-258534
Oct. 3, 1986 [JP] Japan ................................ 61-234606

[51] Int. Cl.$^4$ .......................... H01S 3/00; H01S 3/10
[52] U.S. Cl. ........................................ 372/38; 372/25; 372/26; 372/28; 372/29; 372/33; 372/37
[58] Field of Search ................... 372/38, 37, 26, 28, 372/29, 32, 29, 25, 33; 369/107, 122

[56] References Cited

U.S. PATENT DOCUMENTS

| | | | |
|---|---|---|---|
| 4,009,385 | 2/1977 | Sell | 372/38 |
| 4,430,739 | 2/1984 | McMahan | 372/38 |
| 4,480,325 | 10/1984 | Aiki et al. | 372/43 |
| 4,532,619 | 7/1985 | Sugiyama et al. | 369/122 |
| 4,546,463 | 10/1985 | Opheij et al. | 369/122 |
| 4,679,184 | 7/1987 | Yoshida et al. | 369/122 |

Primary Examiner—William L. Sikes
Assistant Examiner—Georgia Y. Epps
Attorney, Agent, or Firm—Antonelli, Terry & Wands

[57] ABSTRACT

A low-laser-noise semiconductor driver device is provided for use in an optical information processing device which is recordable or erasable and which oscillates a semiconductor laser with a high output when it is recorded or erased. A semiconductor is generally oscillated with a rated maximum output during a recording and erasing operation. Therefore, when high frequency superposition is made in such a high output oscillation state, an oscillation output exceeds the rated output, which badly influences the life of the laser. To obviate this drawback, the high frequency superposition is stopped at the mode of recording or erasing in which the high output oscillation is made by a switching circuit which is controlled by a mode control signal. This reduces the laser noise at the mode of reproducing and also lengthens the life of the semiconductor laser. The semiconductor laser driver device can be also used as a light source of the optical information processing device which can record and/or erase information.

11 Claims, 7 Drawing Sheets

SEMICONDUCTOR LASER DRIVER CIRCUIT

BACKGROUND OF THE INVENTION

The present invention relates to a semiconductor laser driver circuit for reducing laser noise through its multimode oscillation with a high frequency current superposed, more particularly, it relates to a semiconductor laser driver circuit suitably adapted to an optical information processing device which is recordable or erasable and oscillates a semiconductor laser with a high output when it is recorded or erased.

Semiconductor lasers have been typically used as a light source of an optical information processing device such as an optical disk, an optical printer, etc. With the development of the transverse mode control technique of the semiconductor lasers, many semiconductor lasers which oscillate in a primary transversal mode and uniform longitudinal mode have appeared. Such semiconductor lasers, when incorporated in the optical information processing device, however, have had a problem, because of their improved coherency, that when the outgoing light from the semiconductor laser reflects from the edge surface of an optical component or the disk surface to be fed back to the laser, a noise (feedback noise) is disadvantageously generated. This noise is attributable to the fact that the very coherent lights, i.e., the outgoing light and reflecting light, interfere with each other so that the oscillation longitudinal mode of the laser becomes unstable because of its jump or multi-longitudinal mode oscillation. The oscillation longitudinal mode also becomes unstable due to the temperature range. This is because the temperature change shifts the wavelength at a single-longitudinal-mode oscillation continuously and also in a discrete jumping manner. The noise is generated when that wavelength jumps. The noises thus generated may degrade signal-to-noise ratios in the signals in the optical communication or optical disk devices.

In order to reduce the noises, there has been proposed a method for driving the laser at a high frequency by providing a high frequency oscillator in a laser driver circuit, as disclosed in U.S. Pat. No. 4,480,325. This method using high frequency driving intends to reduce the laser noise in the case of the D.C. driving in which the high frequency modulation is continuously modulated.

SUMMARY OF THE INVENTION

An object of the present invention is to provide a laser driver which is advantageous not only in the case of reproducing information in which a semiconductor laser is D.C.-driven to be oscillated with a low output but also in the case of recording or erasing the information in which the semiconductor laser is oscillated with a high output.

The feature of the present invention resides in that the high frequency driving of the laser is performed when the laser is oscillated with a low output at the mode of reproduction while it is stopped when the laser is oscillated with a high output at the mode of recording or erasing. Namely, in prior systems the semiconductor laser is oscillated with a rated maximum output during a recording and erasing operation so that when high frequency superposition is made in such a high output oscillation state, an oscillation output exceeds the rated output, which badly influences the life of the laser. Therefore, in the present invention, the high frequency driving is stopped at the mode of recording or erasing in which the high output oscillation is made, thereby reducing the laser noise at the reproduction mode and also lengthening the life of the semiconductor laser. Thus, the present invention implements a semiconductor laser driver circuit which can be also used as a light source of the optical information processing device which can record and/or erase information.

These and other objects and many of the attendant advantages of this invention will be readily appreciated as the same becomes better understood by reference to the following detailed description when considered in connection with the accompanying drawing, in which like reference numerals refer to like elements in several views.

DESCRIPTION OF THE PREFERRED EMBODIMENTS

Figure 1:
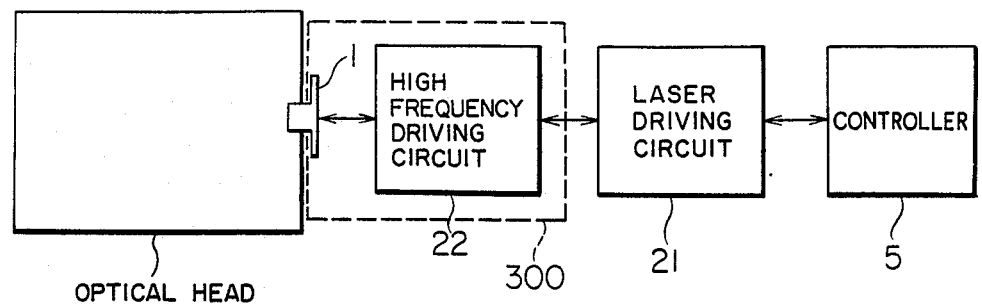
FIG. 1 is a conceptual diagram for showing one embodiment of the semiconductor laser driving device according to the present invention.
Figure 2:
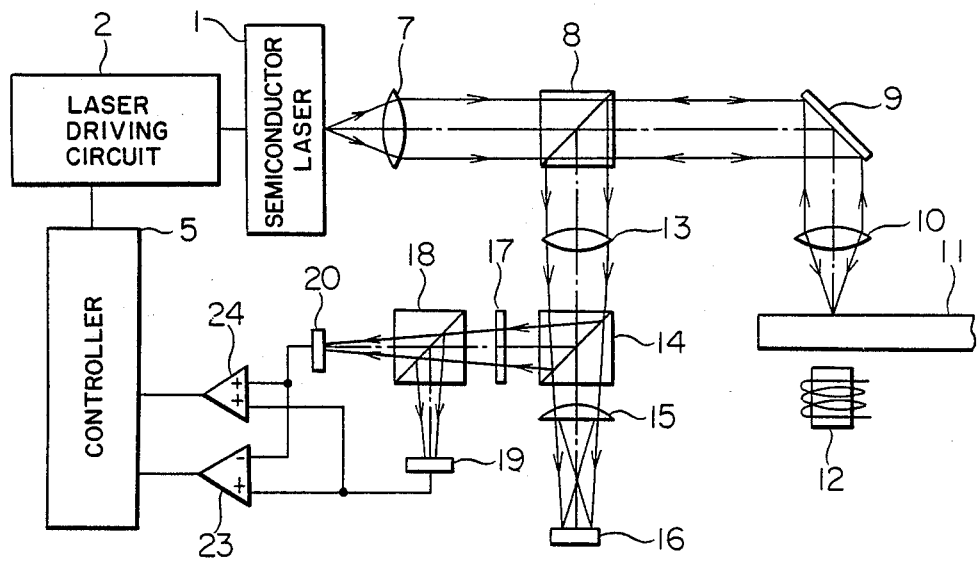
FIG. 2 is a diagram showing an optical magnetic disk device in which the semiconductor laser driving device according to the present invention is used.
Figure 7:
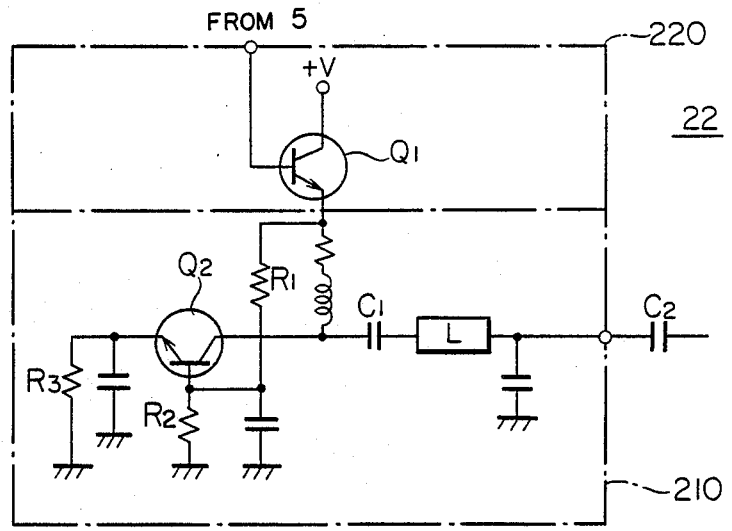
FIG. 7 is a circuit diagram showing one example of a high frequency driving circuit 22 employed in the present invention.
Figure 8:
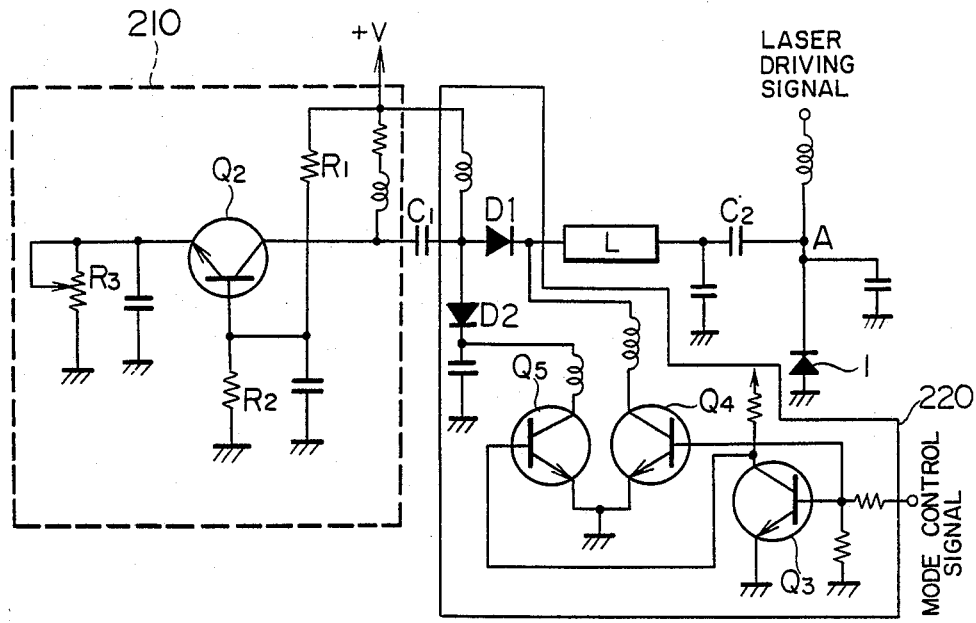
FIG. 8 is a circuit diagram showing another example of the high frequency driving circuit 22 employed in the present invention.
Figure 9:
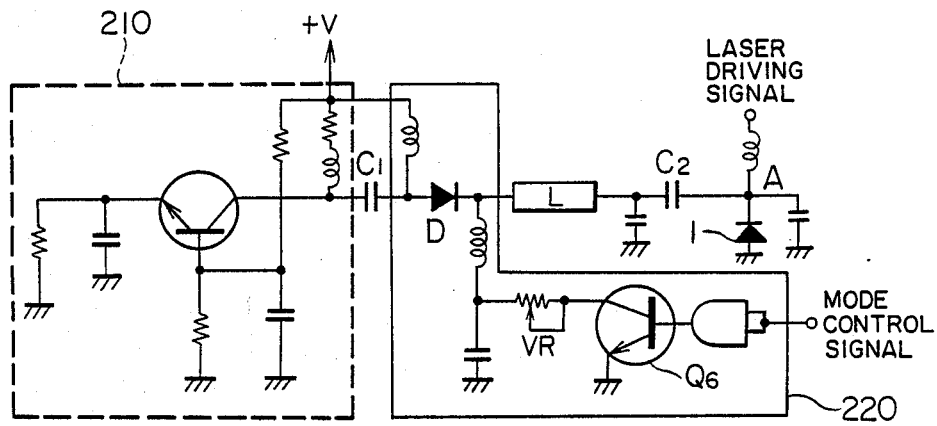
FIG. 9 is a circuit diagram showing a further example of the high frequency driving circuit 22 employed in the present invention.

One embodiment of the present invention will be explained below with reference to FIG. 1. This embodiment relates to the case where the present invention is applied to an optical head for an optical disk; the structure of the optical head itself, explained below in connection with FIG. 2, is well known. In FIG. 1, a semiconductor laser 1, directly connected with a high frequency driving circuit 22, is electromagnetically shielded, in its periphery, by e.g. soft iron 300 so as to prevent the electromagnetic wave from being externally radiated. The high frequency driving circuit 22 can be arranged as a monolithic structure together with the laser 1 on a single chip. From a host controller 5, a mode control signal indicating a recording, reproducing or erasing mode and data signals at the recording mode are transmitted. The laser driving circuit 21 adds the data signal at the recording mode and the mode signal to a D.C. current at the reproduction mode to provide a laser driving signal. The high frequency driver circuit 22 consists of a high frequency oscillation circuit 210 and a switching circuit 220 which controls the superposition of the high frequency signal in accordance with the mode control signal, as shown in FIGS. 7 to 9. The mode control signal serves as a switching signal every sector in a data file for recording digital information while it serves as a switching signal every image (field or frame) in a video disk for recording video information.

This embodiment will be explained in detail with reference to FIG. 2 showing a magneto-optical disk drive in which the present invention is incorporated. The light emanating from the semiconductor laser 1 is condensed by a coupling lens 7 to provide a parallel light. The parallel light is focused as a spot having a diameter of approximately 1 μm on disk 11 covered with a magneto-optical recording film by a focusing lens 10 through a beam splitter 8 and a galvanomirror 9. The magneto-optical recording film, which may be an amorphous compound consisting of a transition metal and a rare-earth metal, e.g. Tb-Fe, Tb-Fe-Co, etc., is a perpendicular magnetic film in which the magnetization is oriented in a direction perpendicular to the film surface. When this film is irradiated with a laser light with a light output, the heat thus generated increases the temperature of the film. When the temperature reaches the Curie's temperature, the magnetization disappears. Then, when an external magnetic field is applied to the film by an electromagnetic coil 12, only the temperature-increased portion is oriented in its magnetization in the direction of the applied magnetic field. If that direction is opposite to the magnetization direction of the surrounding portion, information is recorded on the temperature-increased portion. If that direction is the same as the magnetization direction of the surrounding portion, information is erased. On the other hand, the information reproduction is performed by the use of the Kerr effect that when the linearly polarized light incident on the magnetic film reflects, it provides different optical rotation angles depending on different directions of magnetization. Assuming that the optical rotation angle is $\theta_k$, if the optical rotation angle is $+\theta_k$ in the upward sense of magnetization, it is $-\theta_k$ in the downward sense of magnetization. This optical rotation angle, referred to as a Kerr rotation angle, is as small as approximately 0.35°. The Kerr rotation angle constituting a signal component is contained in the light reflected from the disk 11. The reflected light passes through the focusing lens 10 and the galvanomirror 9 and is separated in two optical paths by the beam splitter 8. The light on one optical path passes through a lens 13 and is separated into a servo system and a signal detection system by a beam splitter 14. The servo system consists of a lens 15 and an optical detector 16; the auto-focussing system and the tracking system using an astigmatism technique and a diffraction differential technique (push-pull method), respectively, locate a light spot on the disk 11 (a driving circuit is not shown). The signal detection system adopts a differential system to provide magneto-optical signals in such a way that the light amount is bisected by a λ/2 plate 17 (λ: semiconductor laser wavelength) and the outputs from photodetectors 19 and 20 are differentiated by a diffential amplifier 23. This diffential system has an effect of reducing the noise due to the variation of light amount, such as laser noise, disk noise, etc. The sum of the outputs from two photodetectors 19 and 20 is taken in an adder 24. This sum, since it represents the amount of the reflecting light from the disk, is used to detect address data previously recorded in the form of unevenesss. The magneto-optical signal and address data thus detected are sent to a controller 5.

Figure 3:
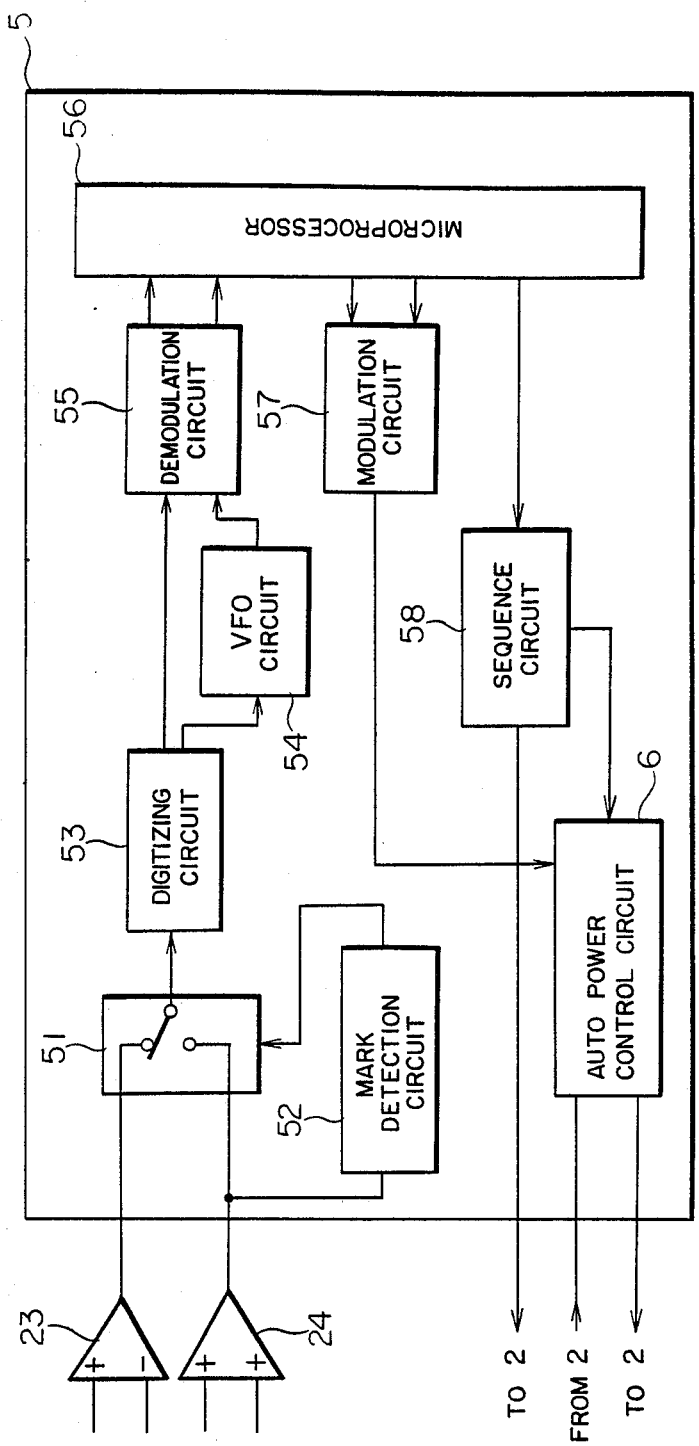
FIG. 3 is a block diagram showing one example of a controller 5 used in the optical magnetic disk device of FIG. 2.

Referring to FIG. 3, the arrangement and operation of the controller 5 will be explained. The magneto-optical signal from the differential amplifier 23 and the address data signal from the adder 24 are switched by an analog switch 51 by the use of a timing signal from a mark detection circuit 52 to which the address data signal is input. Thus, the information signal with the address data is provided. This information signal is digitized in a digitizing circuit 53 and read out as the information data and address data in a demodulation circuit 55 using a clock supplied from a variable frequency oscillator (VFO) circuit 54 which generates read timing clocks. The information data and address data are sent to a microprocessor 56 and recognized there. On the other hand, the information data to be recorded which is sent from the microprocessor 56 at the recording mode are modulated (e.g. 2-7 modulation) in a modulation circuit 57 after having taken their timings. The modulated information data are input to an auto power control circuit 6. A sequence control circuit 58 for controlling the sequence of the device generates a mode signal of recording, reproducing or erasing in accordance with the instruction offered from the microprocessor 56. This mode signal is sent to the auto power control circuit 6 which generates a laser driving signal and performs the auto power control, and the laser driver circuit 2. The auto power control circuit 6 acts to send a laser driving signal (DC +pulse driving) to the laser driving circuit 2 and perform the auto power control in response to a control signal from a monitoring photodetector of the semiconductor laser 1.

Figure 4:
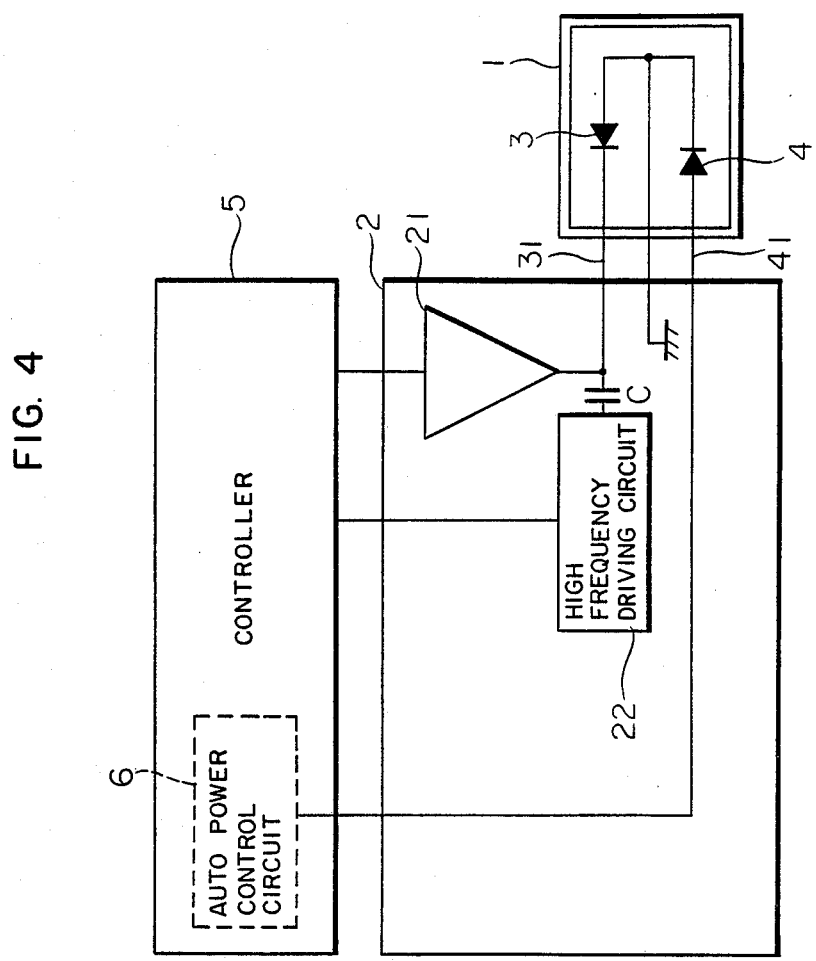
FIG. 4 is a view showing one example of a semiconductor laser 1 and a driver circuit.

The high frequency driving of the semiconductor laser 1 will be explained below referring to FIG. 4. The semiconductor laser 1 consists of a laser chip 3 connected with a driving line 31 and a monitoring photodetector 4 connected with a detection line 41. The driver circuit 2 consists of a driver amplifier 21 and a high frequency driver circuit 22; the driver amplifier 21 generates a laser driving signal in accordance with the recording, reproducing or erasing mode, and the high frequency driving circuit 22 generates. The respective output lines of the driver amplifier 21 and the high frequency driver circuit 22 are directly connected with each other through a capacitor C to constitute a driving line 31. The driver amplifier 21 performs the high output oscillation in response to the high output pulse sent from the host controller 5 at both recording and erasing modes.

Figure 5:
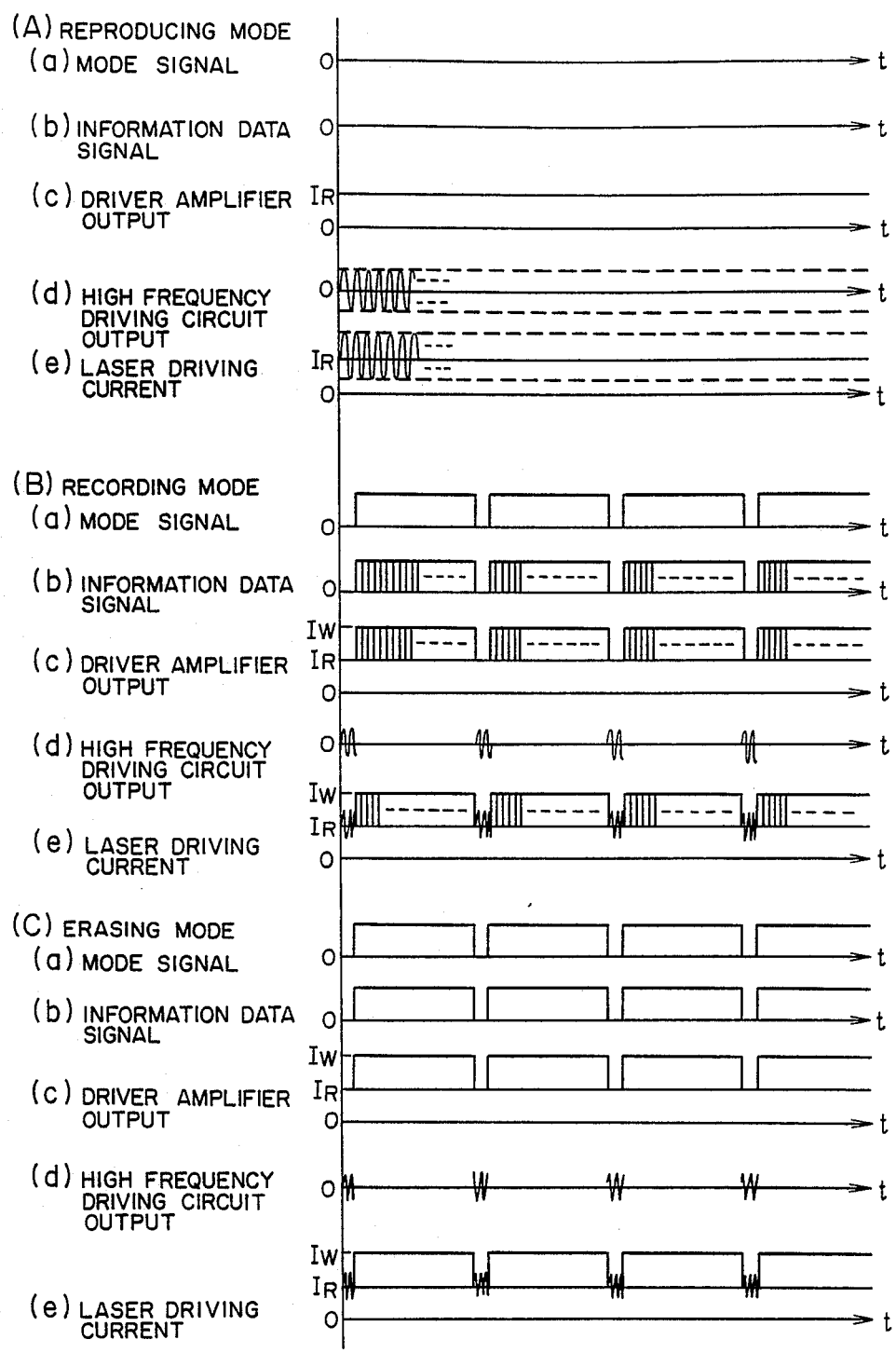
FIG. 5 is a waveform diagram for explaining the operation of the present invention.

The recording, reproducing and erasing mode in the magneto-optical disk will be explained with reference to FIGS. 5 and 6. FIG. 5 shows waveforms at each mode. (A) relates to the reproducing mode; the mode signal (a) remains "L", the information data signal (b) remains "L", the driver amplifier output (c) remains $I_R$ (mA), the high frequency driver circuit output (d) remains at an "ON" state, and the laser driving current (e) is a sum of the driver amplifier output (c) and the high frequency driving circuit output (d) when the high frequency signal is continuously superposed. (B) relates to the recording mode; the mode signal (a) becomes "H" during the period corresponding to a data recording region and becomes "L" during the header reading period, which is performed every sector for the recording with a sector unit, the information data signal (b) is data pulses corresponding to the information to be recorded during the data recording period of each sector, the driver amplifier output (c) becomes a waveform when the information data pulse $I_W$ is superposed on the reproducing current $I_R$, the high frequency driver circuit output (d) becomes a waveform providing a high frequency signal only when the mode signal (a) is "L", and the laser driving current (e) becomes a sum of the driver amplifier output (c) and the high frequency driver circuit output (d), in which the high frequency signal is superposed only when a header signal of each sector is read. (C) relates to the erasing mode which is the same as the recording mode of (B) except that the information data signal (b) is located at a "H" state during the period corresponding to the data recording region of each sector without including the data pulses.

Figure 6:
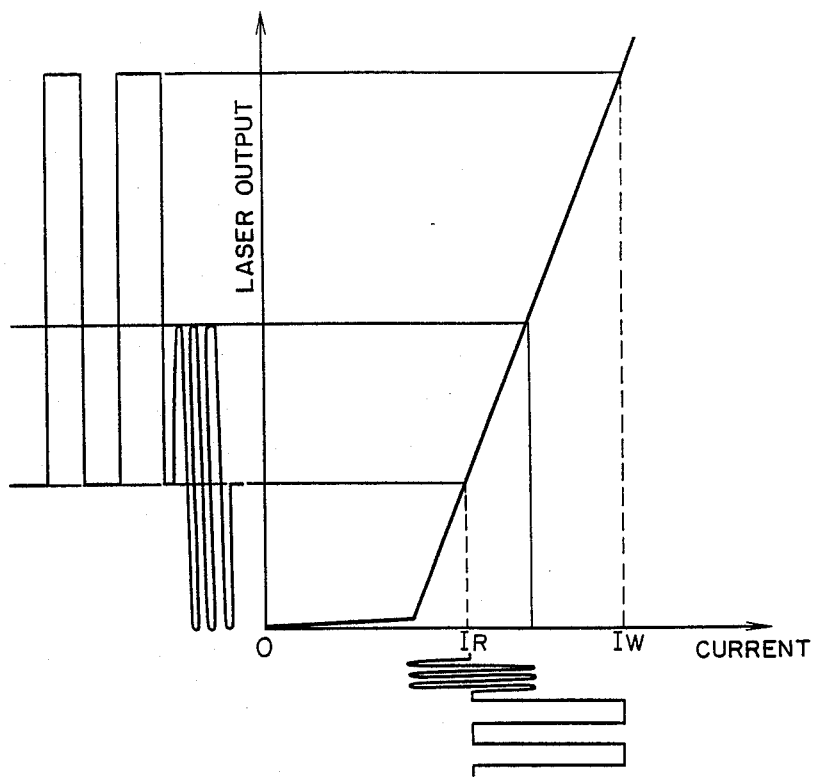
FIG. 6 is a graph showing the driving state of a semiconductor laser.

FIG. 6 shows a laser driving state at each mode, which is referred to FIG. 5. FIG. 7 shows one example of the high frequency driver circuit 22 used in the present invention. The high frequency driver circuit 22 consists of a high frequency circuit 210 and a switching circuit 220 to which the mode is input from the controller 5. The switching circuit 220 serves to control the superposition of the high frequency current from the high frequency oscillation circuit 210 on the laser driving current in accordance with the mode control signal. The high frequency oscillation circuit 210 constitutes an RC oscillator using a transistor $Q_2$ and sustains the oscillation through the connection of an emitter and a base of the transistor. Resistors $R_1$ and $R_2$ serves to determine a base electric potential, which is selected to turn on the transistor $Q_2$. For example, with the voltage $V = +12V$, $R_1$ and $R_2$ are selected such that $R_1 = 6.8$ K$\Omega$ and $R_2 = 4.7$ K$\Omega$. A resistor $R_3$ serves to determine an emitter current of the transistor $Q_2$ and to control the high frequency output current of the collector side thereof. The output current from the collector passes through a capacitor $C_1$, an inductance L made of a thin film coil and a capacitor $C_2$ and added to the laser driving current L. On the other hand, the switching circuit 220 is constituted by a transistor $Q_1$, which, in accordance with the mode control signal from the controller 5, varies the voltage applied to the transistor $Q_2$ and control the high frequency current from the transistor $Q_2$.

Referring back to FIG. 4, a detection line 41 from the monitoring photodetector 4 is led to the auto power control circuit 6 which controls the driver amplifier 21 by the use of the detected control signal so that the laser power corresponding to the D.C. component $I_R$ of the laser driving current can be substantially constant.

Referring to FIGS. 8 and 9, another example of the high frequency driver circuit 22 used in the present invention will be explained below. FIG. 8 shows the case where two diodes ($D_1$, $D_2$) are provided in the switching circuit 220. FIG. 9 shows the case where one diode (D) is provided therein. In FIG. 8, the high frequency oscillation circuit 210 is such as previously shown in FIG. 7 and so the high frequency current is provided from the collector side of the transistor $Q_2$. Two diodes $D_1$ and $D_2$ are used to control this high frequency current. As a diode for this purpose, a PIN diode, which provides good high frequency linearity in the forward direction, is very suitable. The mode control signal drives transistors $Q_4$ and $Q_5$, which constitutes a current switching circuit, through a transistor $Q_3$. When the mode control signal is at a high level, the transistor $Q_3$ is in an ON state (referred to as simply "ON"), and so the transistor $Q_4$ is "ON" and the transistor $Q_5$ is in an OFF state (referred to as simply "OFF").

Then, the PIN diode $D_1$ forward-biased is "ON" and the PIN diode $D_2$ reverse-biased is in "OFF". Thus, when the mode control signal is at the high level, the switching circuit 220 is "ON", and hence the high frequency current is added to the laser driving current. On the other hand, when the mode control signal is at a low level, the transistor $Q_3$ is "OFF" and so the transistor $Q_4$ is "OFF" and the transistor $Q_5$ is "ON". Then, the PIN diode $D_1$ reverse-biased is "OFF" and so provided a high impedance. The PIN diode $D_2$ forward-biased is "ON" and so provides a low impedance. Thus, when the mode control signal is at the low level, the switching circuit 220 is "OFF" so that the high frequency current from the high frequency oscillator 210 is cut and the addition thereof to the laser driving current is stopped.

The high frequency driver circuit 22 formed of the high frequency oscillation circuit 210 and the switching circuit 220 shown in FIG. 9 where one diode is used is also operated in the same way as that shown in FIG. 8. When the mode signal is at the high level, a transistor $Q_6$ is "ON" and a diode D is forward-biased and so provides a low impedance. Therefore the high frequency current is added to the laser driving current. Incidentally, if a variable resistor VR is provided at the collector side of the transistor $Q_6$, the bias current to the diode D is varied in accordance with the value of the VR. Thus, the amplitude of the high frequency current is controlled so that the amount of the high frequency current to be added to can be varied. When the mode control signal is at the low level, the transistor $Q_6$ is "OFF" and the diode D reverse-biased provides a high impedance. Thus, the addition of the high frequency current to the laser driving current is stopped.

In the switching circuit using a PIN diode(s) as mentioned above, the separation ratio between its ON and OFF is assured to be approximately 20 dB for one diode, although the ratio depends on the value of the impedance consisting of the forward bias resistance of the PIN diode(s), the reverse bias resistance thereof, an inductance L, etc. Thus, in the case of FIG. 8, the separation ratio of approximately 40 dB is assured and in the case of FIG. 9, that of approximately 20 dB is assured.

In FIGS. 8 and 9, a point A is a point where the sum of the high frequency current and the laser driving signal from the laser driver circuit 21 is taken. The semiconductor laser 1 is driven by this sum signal. The switching time of the switching circuit 220 in which a PIN diode is used as $D_1$, $D_2$ and D is 1 µs or less. By using the switching circuit as mentioned above, the superposition of the high frequency signal can be ON/OFF controlled.

Figure 10:
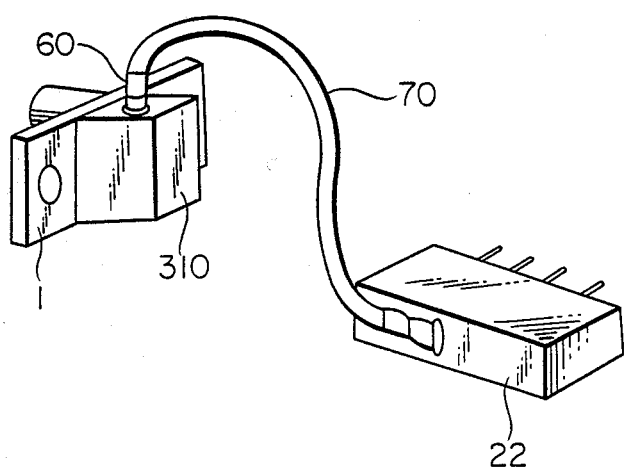
FIG. 10 is a perspective view showing another embodiment of the present invention.

Referring to FIG. 10, another embodiment of the present invention will be explained. Whereas in the above embodiment, the semiconductor laser 1 and the high frequency driver circuit 22 are directly connected with each other, in this embodiment, they are separated from each other. And, a connector 60 attached at the side of the semiconductor laser, electromagnetically shielded by a shield case 310, is connected with the high frequency driver circuit 22 through a coaxial cable 70. Such an arrangement allows the shape of the laser part to be made compact and only the laser to be exchanged even when the laser malfunctions. Incidentally, the laser driving signal including the high frequency current and the data pulses may be sent through the coaxial cable 70 while the monitoring output which is used to control the laser output may be sent through another line distinct from the coaxial cable 70.

In accordance with the present invention, the high frequency superposition can be stopped when a laser performs a high-output oscillation, e.g. during a recording or erasing operation so that the problem of the life of the laser can be obviated, and noise can be reduced by the high frequency superposition when the laser performs a low-output oscillation during a reproduction operation.

The present invention was implemented for Hitachi Semiconductor Laser HL-8314E type (830 nm, 30 mW output). As a result, the relative noise level, RIN value was reduced by two orders of magnitude at the low-output oscillation during the reproduction operation. Even when the high frequency superposition was stopped at the high-output oscillation during the recording and erasing operation, any error was not generated in the recorded data. Then, the high frequency oscillation frequency was from 600 MHz to 800 MHz and the current modulation degree was 140 to 160%.

We claim:

1. A semiconductor laser driver circuit comprising:
   a semiconductor laser;
   a high frequency oscillation circuit coupled to said semiconductor laser for superposing as high frequency current on a driving current for driving said semiconductor laser; and
   a control circuit coupled to said high frequency oscillation circuit for controlling said high frequency current so as to stop the superposition of the high frequency current on said driving current at predetermined high-output oscillation levels of the semiconductor laser and to perform said superposition at predetermined low-output oscillation levels of the semiconductor laser.

2. A semiconductor laser driver circuit according to claim 1, wherein said control circuit is a switching circuit which controls the superposition of said high frequency current on said driving current in accordance with a mode signal as an input indicative of at least recording and reproducing, said switching circuit being provided between said high frequency oscillation circuit and said semiconductor laser and ON-OFF controlling the supply of said high frequency current to said semiconductor laser.

3. A semiconductor laser drive circuit according to claim 1, wherein said semiconductor laser is used as a light source of a magneto-optical recording device in which the magnetization direction is inverted in accordance with the information to be recorded by irradiating the perpendicular magnetic film of a recording medium with a laser light and applying a magnetic filed thereto from a magnetic coil to the perpendicular magnetic film of the recording medium in a direction perpendicular thereto.

4. A semiconductor laser drive circuit according to claim 1, wherein said semiconductor laser has a photodetector coupled to said control circuit for monitoring the output of said semiconductor laser, and further wherein an output of said semiconductor laser is controlled by an output of said photodetector.

5. A semiconductor laser driver circuit according to claim 1, wherein said semiconductor laser and said high frequency oscillation circuit are connected with each other through a coaxial cable.

6. A semiconductor laser driver circuit according to claim 2, wherein at least one PIN diode is used in said switching circuit, said at least PIN diode being connected between said high frequency oscillation circuit and said semiconductor laser.

7. A semiconductor laser driver circuit for use in an optical information processing system which has at least first and second operating modes, said laser driver circuit comprising:
   a semiconductor laser;
   means coupled to said semiconductor laser for generating a predetermined driving current for driving said semiconductor laser;
   mode determining means coupled to said optical information processing system for determining which mode said optical information processing system is in;
   a high frequency oscillation circuit coupled to said generating means for superposing a high frequency current on said predetermined driving said semiconductor laser with a combination of said predetermined driving current and said high frequency current; and
   a control circuit coupled to said high frequency oscillation circuit and to said mode determining means for permitting said high frequency oscillation circuit to superpose said high frequency current on said predetermined driving current when said optical information processing system is in the first operation mode and for stopping the superposing of said high frequency current on said predetermined driving current when said optical information processing system is in the second operating mode.

8. A semiconductor laser driver circuit according to claim 7, wherein said first mode is an information reproducing mode and said second mode is an information recording mode.

9. A semiconductor laser driver circuit according to claim 8, wherein said optical information processing system also includes an information erasing mode, and wherein said control circuit includes means for stopping the superposing of said high frequency current on said predetermined driving current when said optical information processing system is in said erasing mode.

10. A semiconductor laser driver circuit according to claim 1, wherein said control circuit comprises a switching circuit provided between said semiconductor laser and said high frequency oscillation circuit so as to prevent superposing of the high frequency current when a combination of the driving current and the high frequency current would drive the semiconductor laser to an output oscillation level high than a predetermined rated maximum level for the semiconductor laser.

11. A semiconductor laser driver circuit according to claim 7, wherein said control circuit comprises a switching circuit provided between said semiconductor laser and said high frequency oscillation circuit so as to prevent superposing of the high frequency current when a combination of the driving current and the high frequency current would drive the semiconductor laser to an output oscillation level higher than a predetermined rated maximum level for the semiconductor laser.

* * * * *